(12) United States Patent
Homma et al.

(10) Patent No.: US 6,532,174 B2
(45) Date of Patent: Mar. 11, 2003

(54) SEMICONDUCTOR MEMORY DEVICE HAVING HIGH SPEED DATA READ OPERATION

(75) Inventors: Yoshikazu Homma, Kawasaki (JP); Tetsuji Takeguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 24 days.

(21) Appl. No.: 09/739,395

(22) Filed: Dec. 19, 2000

(65) Prior Publication Data

US 2001/0048610 A1 Dec. 6, 2001

(30) Foreign Application Priority Data

Jun. 2, 2000 (JP) ........................................ 2000-166322

(51) Int. Cl.[7] .............................................. G11C 16/06
(52) U.S. Cl. ............................... 365/185.2; 365/189.11; 365/189.07
(58) Field of Search ....................... 365/189.11, 189.07, 365/185.2

(56) References Cited

U.S. PATENT DOCUMENTS 5,886,927 A * 3/1999 Takeuchi ............... 365/185.22
6,215,697 B1 * 4/2001 Lu et al. ................. 365/185.03
6,301,156 B1 * 10/2001 Kurosaki ................. 365/185.2
6,370,061 B1 * 4/2002 Yachareni et al. ...... 365/185.22

FOREIGN PATENT DOCUMENTS

JP          10-289595           10/1998

* cited by examiner

*Primary Examiner*—David Nelms
*Assistant Examiner*—Connie C. Yoha
(74) *Attorney, Agent, or Firm*—Arent Fox Kintner Plotkin & Kahn, PLLC

(57) ABSTRACT

The present invention provides a semiconductor memory device that performs a highly reliable data read operation at a high speed. This semiconductor memory device reads data stored in memory cells in accordance with a result of a comparison between a signal read out from the memory cells, which are connected to a word line, with a signal read out from a reference cell connected to a reference word line. This semiconductor memory device includes a load capacity adjustment circuit that adjusts the timing of starting up the gate of the reference cell in accordance with each location of the connection of the memory cells to the word line.

3 Claims, 7 Drawing Sheets

SEMICONDUCTOR MEMORY DEVICE HAVING HIGH SPEED DATA READ OPERATION

BACKGROUND OF THE INVENTION

1. Field of the Invention

The present invention generally relates to semiconductor memory devices, and, more particularly, to a semiconductor memory device that can perform a highly reliable data read operation at a high speed.

2. Description of the Related Art

As a semiconductor memory device that reads data by comparing a memory cell with a read reference cell, there is a nonvolatile semiconductor memory device that stores data utilizing differences in threshold voltage.

In a stacked-gate nonvolatile semiconductor memory device such as a flash memory, for instance, data is stored utilizing variations in threshold voltage depending on the number of electrons in a floating gate. In such a case, the threshold voltage is set as follows.

In a case of memory cells that store digital data, the threshold voltage of the memory cells that constitute a memory cell array is set within one of two threshold voltage ranges. The threshold voltage of a memory cell that stores "1" is lower than a first threshold voltage. The threshold voltage of a memory cell that stores "0" is higher than a second threshold voltage. Here, the first threshold voltage is lower than the second threshold voltage. Meanwhile, the threshold voltage of a read reference cell is set between the first and second threshold voltages in advance.

The difference between the threshold voltage of the reference cell and the threshold voltage of a memory cell that stores "1" or "0" serves as a threshold voltage margin (hereinafter referred to as "read margin") for reading the data "1" or "0". The above relationship between threshold voltages also holds in a semiconductor memory device that stores multilevel data in memory cells.

Next, a data reading method in which data is read in accordance with the difference between the threshold voltages of the reference cell and a memory cell will be described. Cell currents flowing through the memory cell and the reference cell are converted into voltages, and a comparator circuit 11 then compares the voltages. As shown in FIG. 1, a comparison result signal RS depending on the relationship between the threshold voltages of the reference cell and the memory cell is obtained. In accordance with the comparison result signal RS, it is determined whether the read data is "1" or "0". In this method, it is essential to make the comparison with the conditions of the gates, the drains, the sources, and the back biases being all equalized between the reference cell and the memory cell to be read.

Meanwhile, as portable information devices have become widely spread in recent years, there has been an increasing demand for nonvolatile semiconductor memory devices that performs at lower voltages. To achieve a low voltage operation, the word line is boosted so as to increase the cell current difference between the reference cell and a memory cell from which data is read out. The boosting is performed at the start of a read operation so as to reduce the standby current of the nonvolatile semiconductor memory device. Likewise, the biasing of the bit line is performed only during a data read operation, and no biasing is performed while standing by.

The timings of boosting the word line and biasing the bit line are controlled by a timing circuit.

However, since the distance between a memory cell and a word line driver or a bit line bias circuit varies depending on the location of the memory cell, there is a difference in signal transmission time among memory cells. As a result, at the early stage of a data read operation, differences are also caused to the bias conditions of the gates and drains. To solve this problem, a sufficient time is maintained so as to make uniform the bias conditions between the gate and drain of a memory cell prior to the cell current comparison between the reference cell and the memory cell. However, this is a hindrance to a high-speed read operation.

In a case where no extra time is ensured before the cell current comparison so as to perform a high-speed read operation, on the other hand, there is a problem that the read margin is reduced. Since the read margin depends on the location of each memory cell, problems (described later) might arise.

FIG. 1 shows the structure of a conventional nonvolatile semiconductor memory device. This nonvolatile semiconductor memory device comprises a timing circuit 1, a word line driver 3, a bit line decoder 5, a reference word line driver 7, cascode-type sense circuits 9 and 10, the comparator circuit 11, dummy cells 12, memory cells MC0 to MCn, a reference cell RC, a word line WL, a reference word line RWL, bit lines BL0 to BLn, and a reference bit line RBL.

The word line driver 3 and the reference word line driver 7 are connected to the timing circuit 1, and drive the word line WL and the reference word line RWL, respectively. A booster power voltage VPP is supplied to the word line driver 3 and the reference word line driver 7. An activation signal AS for activating each driver is supplied from the timing circuit 1. The word line driver 3 selects the word line WL for activation, in accordance with a select signal SS.

The gate of each of the memory cells MC0 to MCn is connected to the word line WL, while the source is grounded. The bit lines BL0 to BLn are selectively activated by the bit line decoder 5, in accordance with column address signals CA0 and CA1 and their inversion signals CA0B and CA1B. The bit line decoder 5 will be described later in greater detail.

Like the memory cells MC0 to MCn, the gate of the reference cell RC is connected to the reference word line RWL, while the source is grounded. The drain of the reference cell RC is connected to the reference bit line RBL. The dummy cells 12 as the equivalents of the memory cells MC0 to MC(n−1) are also connected to the reference word line RWL.

The cascode sense circuit 9 is connected to the bit line decoder 5, and the cascode sense circuit 10 is connected to the reference bit line RBL. The cascode sense circuits 9 and 10 will be described later in greater detail. The comparator circuit 11 is connected to the cascode sense circuits 9 and 10.

FIG. 2 is a circuit diagram showing the structure of the bit line decoder 5. In this example shown in FIG. 2, four memory cells MC0 to MC3 are connected to the word line WL. As shown in FIG. 2, n-channel MOS transistors NT7 and NT8 are connected in series to the bit line BL0. The column address signal CA0B is supplied to the gate of the n-channel MOS transistor NT7, while the column address signal CA1B is supplied to the gate of the n-channel MOS transistor NT8.

In parallel with the n-channel MOS transistor NT7, an n-channel MOS transistor NT9 is connected to the bit line BL1, and the column address signal CA0 is supplied to the gate of the n-channel MOS transistor NT9.

Likewise, n-channel MOS transistors NT10 and NT11 are connected in series to the bit line BL2. The column address signal CA0B is supplied to the gate of the n-channel MOS transistor NT10, while the column address signal CA1 is supplied to the gate of the n-channel MOS transistor NT11. In parallel with the n-channel MOS transistor NT10, an n-channel MOS transistor NT12 is connected to the bit line BL3, and the column address signal CA0 is supplied to the gate of the n-channel MOS transistor NT12.

The bit line decoder 5 having the above structure operates in the following manner. When high-level column address signals CA0B and CA1B are supplied to the bit line decoder 5, the bit line BL0 is activated, and data DATAB is read out from the memory cell MC0.

When high-level column address signals CA0 and CA1B are supplied to the bit line decoder 5, the bit line BL1 is activated, and the data DATAB is read out from the memory cell MC1. When high-level column address signals CA0B and CA1 are supplied to the bit line decoder 5, the bit line BL2 is activated, and the data DATAB is read out from the memory cell MC2. When high-level column address signals CA0 and CA1 are supplied to the bit line decoder 5, the bit line BL3 is activated, and the data DATAB is read out from the memory cell MC3.

FIG. 3 is a circuit diagram showing the structure of the cascode sense circuit 10 shown in FIG. 1. As shown in FIG. 3, this cascode sense circuit 10 comprises a load 13, n-channel MOS transistors NT1 to NT3, and an inversion circuit INV. Here, the load 13 is connected to a node that supplies a power voltage VDD, and the n-channel MOS transistors NT1 to NT3 are connected in series to the load 13. The n-channel transistor NT3 is connected to the reference cell RC. The input node of the inversion circuit INV is connected to the source of the n-channel MOS transistor NT1, while the output mode of the inversion circuit INV is connected to the gate of the n-channel MOS transistor NT1.

In the cascode sense circuit 10 having the above structure, the drain of the n-channel MOS transistor NT1 is connected to the comparator circuit 11, so that a signal SAREF corresponding to the data DATAB read out from the reference cell RC is supplied to the comparator circuit 11. In other words, this cascode sense circuit 10 generates the signal SAREF having a voltage corresponding to a cell current flowing through the reference cell RC, and supplies the signal SAREF to the comparator circuit 11.

The cascode sense circuit 9 has the same structure as the cascode sense circuit 10, generating a signal SAI that has a voltage depending on a cell current flowing through a selected memory cell. The generated signal SAI is also supplied to the comparator circuit 11.

In the conventional nonvolatile semiconductor memory device having the above structure, a first distance between a selected one of the memory cells MC0 to MCn to be read and the word line driver 3 on the word line WL differs from a second distance between the reference cell RC and the reference word line driver 7 on the reference word line RWL. Because of this difference between the first distance and the second distance, there might be times that a sufficient read margin cannot be maintained. For instance, if the memory cell MCn is selected to be an object to be read, the first distance and the second distance are almost the same. If the memory cell MC0 is selected, the first distance becomes much shorter than the second distance.

Referring now to FIG. 4, the influence that the locations of the cells have on the read margin will be described below. FIG. 4 is a graph in which the abscissa axis shows the time while the ordinate axis shows the voltage. This graph shows a gate voltage V0g of the memory cell MC0, a gate voltage Vng of the memory cell MCn, signals SAI0(0) and SAI0(1) corresponding to the data "0" and "1" read from the memory cell MC0, signals SAIn(0) and SAIn(1) corresponding to the data "0" and "1" read from the memory cell MCn, and the signal SAREF supplied from the cascode sense circuit 10 to the comparator circuit 11.

When the word line driver 3 activates the word line WL, the gate voltage Vng of the memory cell MCn is delayed with respect to the gate voltage V0g of the memory cell MC0, and then increased. The waveforms of the signals SAI(0) and SAI(1) corresponding to the data "0" and "1" read from the memory cells vary with the locations of the memory cells. For instance, the signal SAIO(0) corresponding to the data "0" read from the memory cell MC0 has a smaller value than the signal SAREF prior to the time t0, and as a result, the data "0" cannot be read out properly.

When the data "0" is read from the memory cell MC0, in order to maintain the same read margin as in the case of reading the data from the memory cell MCn, the comparator circuit 11 needs to determine whether the data is "0" or "1" after the time t1 shown in FIG. 4. This becomes a hindrance to a high-speed operation.

SUMMARY OF THE INVENTION

A general object of the present invention is to provide semiconductor memory devices in which the above disadvantages are eliminated.

A more specific object of the present invention is to provide a semiconductor memory device that can perform a highly reliable data read operation at a high speed.

The above objects of the present invention are achieved by a semiconductor memory device that comprises:

a memory cell having a gate connected to a word line, a first signal being read out from the memory cell;

a reference cell having a gate connected to a reference word line, a second signal being read out from the reference cell; and a boosting adjustment unit that adjusts timing of starting up the gate of the reference cell in accordance with a location of connection of the gate of the memory cell to the word line.

In this semiconductor memory device, data stored in the memory cell is read out in accordance with a result of a comparison between the first signal and the second signal.

With this semiconductor memory device, the gate of the reference cell can be started up at the same timing as the gate of the memory cell to be read, regardless of the location of the connection of the memory cell to the word line.

The above objects of the present invention are also achieved by a semiconductor memory device that reads data stored in a memory cell in accordance with a result of a comparison between one of reference signals and a signal read out from the memory cell having a gate connected to a word line, said device comprising:

a plurality of reference cells that have gates connected to different locations on a reference word line, and hold the reference signals; and a select unit that selects one of the reference signals read out from the plurality of reference cells for the comparison, in accordance with a location of connection of the gate of the memory cell to the word line.

With this semiconductor memory device, a data read operation can be performed using a reference cell that has gate boosting timing substantially the same as the memory cell to be read.

The above objects of the present invention are also achieved by a semiconductor memory device that comprises:

a memory cell connected to a bit line, a first signal being read out from the memory cell;

a reference cell connected to a reference bit line, a second signal being read out from the reference cell; and a resistance adjustment unit that adjusts a resistance value of the reference bit line in accordance with a location of connection of the memory cell to the bit line. In this semiconductor memory device, data is read out from the memory cell in accordance with a result of a comparison between the first signal and the second signal.

With this semiconductor memory device, the timing of reading the second signal from the reference cell can be made equal to the timing of reading the first signal from the memory cell, regardless of the location of the connection of the memory cell to the bit line.

The above and other objects and features of the present invention will become more apparent from the following description taken in conjunction with the accompanying drawings.

DESCRIPTION OF THE PREFERRED EMBODIMENTS

Figure 1:
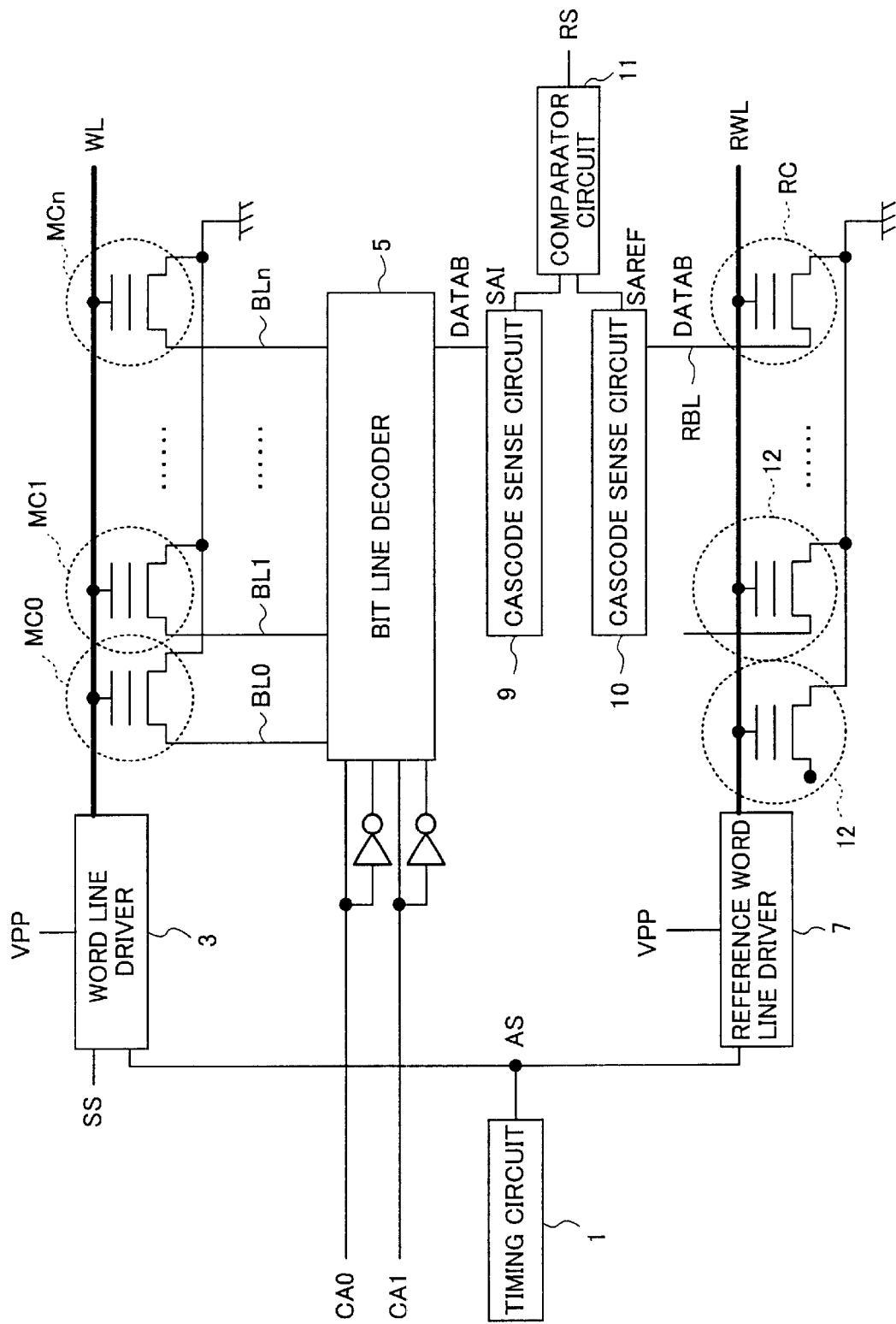
FIG. 1 shows the structure of a conventional nonvolatile semiconductor memory device.
Figure 2:
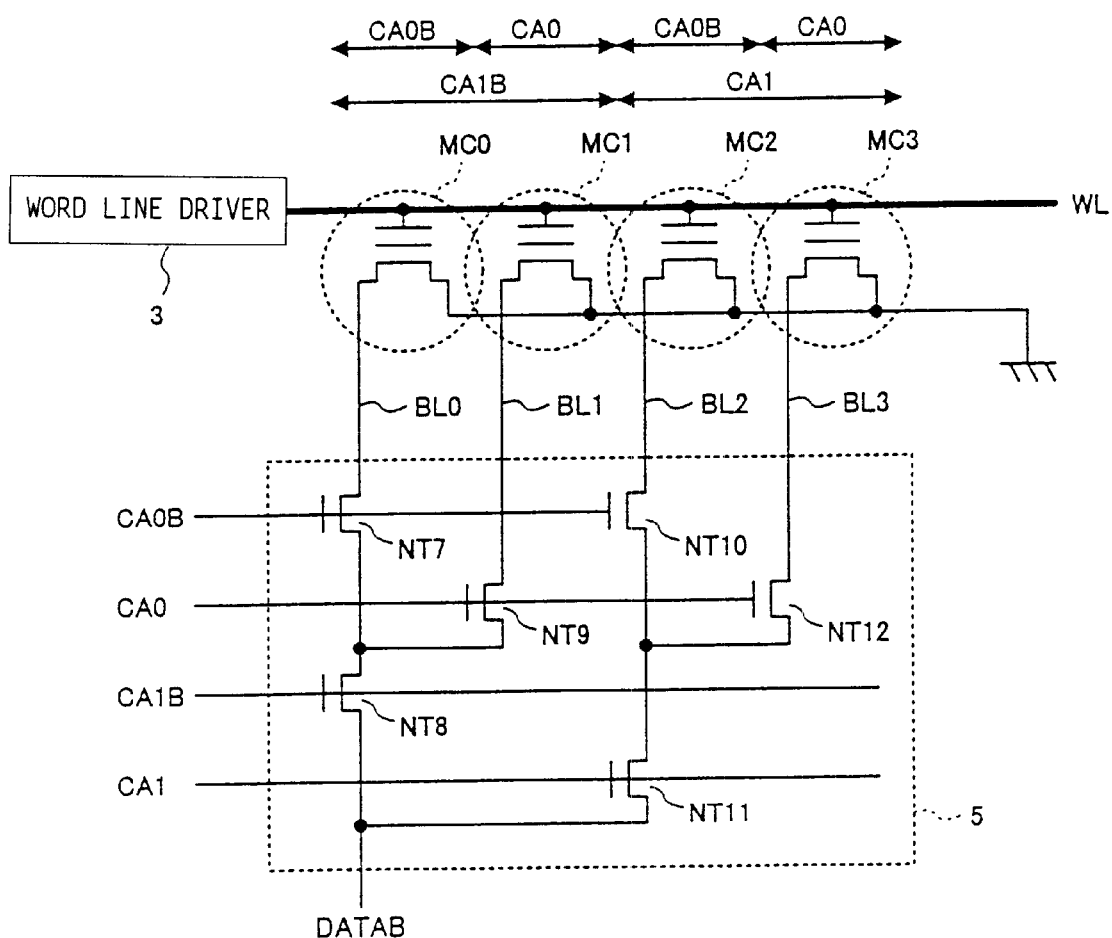
FIG. 2 is a circuit diagram showing the structure of a bit line decoder shown in FIG. 1.

The following is a description of embodiments of the present invention, with reference to the accompanying drawings. In the drawings, like components are indicated by like reference numerals.

[First Embodiment]

Figure 5:
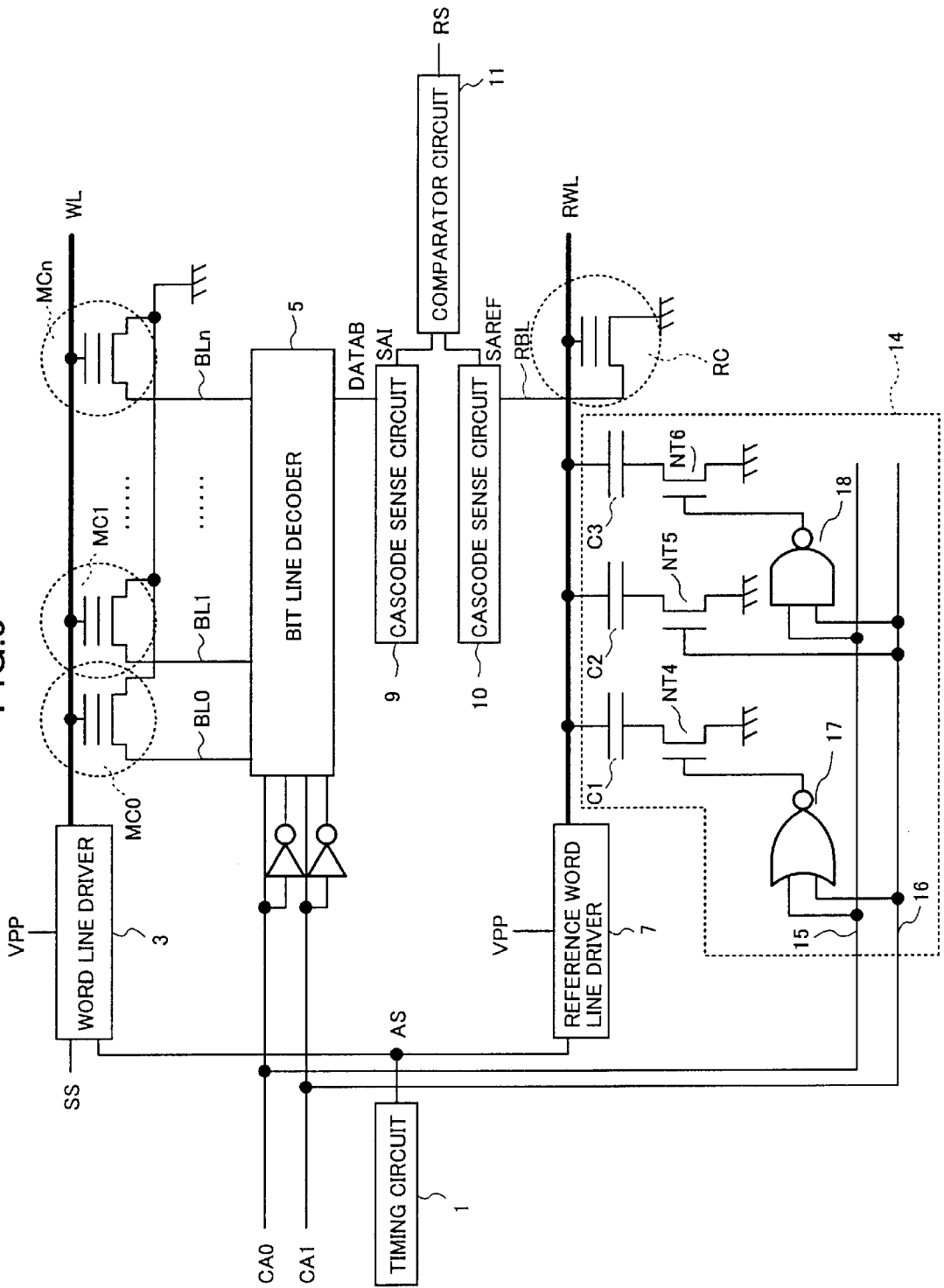
FIG. 5 is a circuit diagram showing the structure of a nonvolatile semiconductor memory device in accordance with a first embodiment of the present invention.

FIG. 5 is a circuit diagram showing the structure of a nonvolatile semiconductor memory device in accordance with a first embodiment of the present invention. As shown in FIG. 5, the nonvolatile semiconductor memory device of this embodiment differs from the conventional nonvolatile semiconductor memory device shown in FIG. 1 in that the dummy cells 12 are replaced by a load capacity adjustment circuit 14. As shown in FIG. 5, this load capacity adjustment circuit 14 comprises signal lines 15 and 16, an OR circuit 17, an AND circuit 18, capacity elements C1, C2, and C3, and n-channel MOS transistors NT4 to NT6.

The signal line 15 transmits the column address signal CA0, and the signal line 16 transmits the column address signal CA1. The OR circuit 17 and the AND circuit 18 are connected to the signal lines 15 and 16, and one of the electrodes of each of the capacity elements C1, C2, and C3 is connected to the reference word line RWL. The gate of the n-channel MOS transistor NT4 is connected to the output node of the OR circuit 17, and the source is grounded. The drain of the n-channel MOS transistor NT4 is connected to the other electrode of the capacity element C1. Likewise, the gate of the n-channel MOS transistor NT5 is connected to the signal line 16, and the source is grounded. The drain of the n-channel MOS transistor NT5 is connected to the other electrode of the capacity element C2. The gate of the n-channel MOS transistor NT6 is connected to the output node of the AND circuit 18, and the source is grounded. The drain of the n-channel MOS transistor NT6 is connected to the other electrode of the capacity element C3.

Next, an operation performed by the nonvolatile semiconductor memory device of the first embodiment having the above structure will be described below. When low-level column address signals CA0 and CA1 are supplied to the bit line decoder 5, for instance, the bit line decoder 5 selects the memory cell MC0 as an object to be read. Since the low-level column address signals CA0 and CA1 are being transmitted through the signal lines 15 and 16 at this point, the n-channel MOS transistors NT4 to NT6 are all switched off, so that no load is added to the reference word line RWL by the capacity elements C1, C2, and C3.

Meanwhile, when a high-level column address signal CA0 and a low-level column address signal CA1 are supplied to the bit line decoder 5, the memory cell MC1 is selected by the bit line decoder 5. Since the high-level column address signal CA0 is being transmitted through the signal line 15 and the low-level column address signal CA1 is being transmitted through the signal line 16 at this point, the output signal of the OR circuit 18 becomes high to switch only the n-channel MOS transistor NT4 on. By doing so, a load is added to the reference word line RWL by the capacity element C1. Accordingly, depending on the distance between the gate of the memory cell MC1 and the word line driver 3, the boosting time of the reference word line RWL is delayed.

Likewise, when high-level column address signals CA0 and CA1 are supplied to the bit line decoder 5, the memory cell MC3 is selected as an object to be read. Since the high-level column address signals CA0 and CA1 are being transmitted through the signal lines 15 and 16 at this point, the n-channel MOS transistors NT4 to NT6 are all switched on, and the capacity elements C1 to C3 add a load to the reference word line RWL. By doing so, depending on the distance between the gate of the memory cell MC3 and the word line driver 3, the boosting time of the reference word line RWL is further delayed.

In the nonvolatile semiconductor memory device of the first embodiment, the load capacity adjustment circuit 14 adjusts the load capacity of the reference word line RWL to be the same as the load capacity of the word line WL, depending on the distance between the word line driver 3 and the memory cell to be read. Accordingly, by adjusting a boosting time constant of the reference word line RWL in accordance with the location of a memory cell to be read, the gate of the reference cell RC can be started up at the same timing as the gate of the memory cell to be read. By doing so, the data read conditions are equalized between the reference cell and the memory cell to be read. Thus, a sufficient read margin can be maintained, and a highly reliable data read operation can be performed at a high speed.

[Second Embodiment]

A nonvolatile semiconductor memory device in accordance with a second embodiment of the present invention has substantially the same structure as the nonvolatile semiconductor memory device of the first embodiment, except that the load capacity adjustment circuit 14 is replaced with a load resistance adjustment circuit 19.

Figure 6:
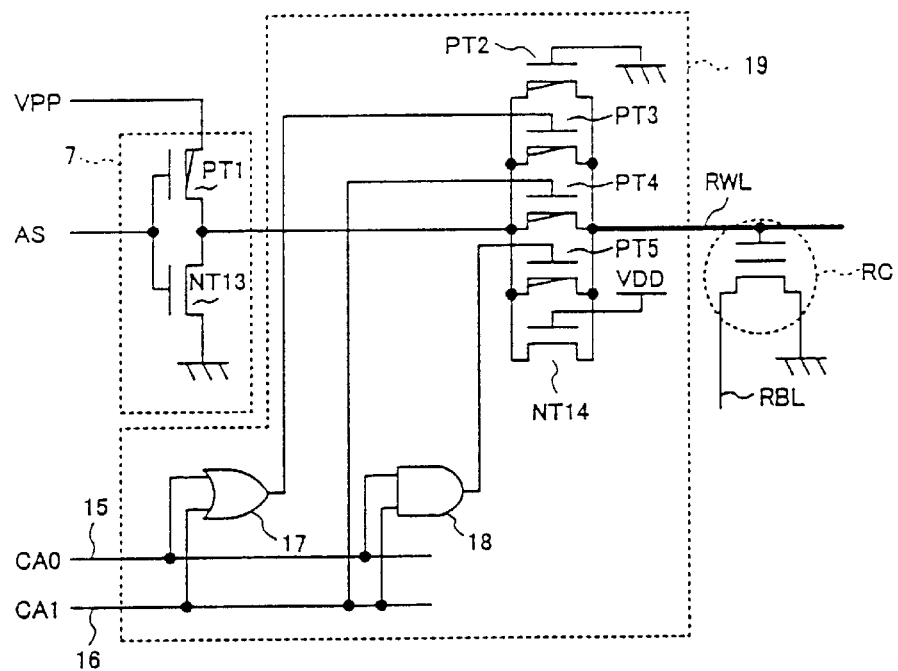
FIG. 6 is a circuit diagram showing the structure of a nonvolatile semiconductor memory device in accordance with a second embodiment of the present invention.

In the following, the load resistance adjustment circuit 19 will be described in detail. FIG. 6 is a circuit diagram showing a part of the structure of the nonvolatile semiconductor memory device of the second embodiment of the present invention. As shown in FIG. 6, the load resistance adjustment circuit 19 comprises an OR circuit 17, an AND circuit 18, and p-channel MOS transistors PT2 to PT5 and an n-channel MOS transistor NT14 all connected in parallel between the reference word line driver 7 and the reference word line RWL.

Here, the gate of the p-channel MOS transistor PT2 is grounded, the gate of the p-channel MOS transistor PT3 is connected to the output node of the OR circuit 17, and the gate of the p-channel MOS transistor PT4 is connected to the signal line 16. The gate of the p-channel MOS transistor PT5 is connected to the output node of the AND circuit 18, and the gate of the n-channel MOS transistor NT14 is connected to a node that supplies a power source voltage VDD. Accordingly, the p-channel MOS transistor PT2 and the n-channel MOS transistor NT14 are always in the ON state.

As shown in FIG. 6, the reference word line driver comprises a p-channel MOS transistor PT1 and an n-channel MOS transistor NT13. A word line booster voltage VPP is supplied to the source of the p-channel MOS transistor PT1, and a reference word line activation signal AS is supplied to the gate of the p-channel MOS transistor PT1. The source of the n-channel MOS transistor NT13 is grounded, and the reference word line activation signal AS is supplied to the gate of the n-channel MOS transistor NT13.

Next, an operation performed by the nonvolatile semiconductor memory device of the second embodiment having the above structure will be described. When low-level column address signals CA0 and CA1 are supplied to the bit line decoder 5, for instance, the memory cell MC0 is selected as an object to be read. Since the low-level column address signals CA0 and CA1 are being transmitted through the signal lines 15 and 16 at this point, the p-channel MOS transistors PT3 to PT5 are all switched on. Accordingly, all the MOS transistors connected in parallel between the reference word line RWL and the reference word line driver 7 are switched on, thereby minimizing the load resistance of the reference word line RWL.

Meanwhile, when a high-level column address signal CA0 and a low-level column address signal CA1 are supplied to the bit line decoder 5, the memory cell MC1 is selected as an object to be read. Since the high-level column address signal CA0 is being transmitted through the signal line 15 and the low-level column address signal CA1 is being transmitted through the signal line 16 at this point, the output signal of the OR circuit 17 becomes high to switch only the p-channel MOS transistor PT3 off. By doing so, the load resistance by the p-channel MOS transistor PT3 is added to the reference word line RWL. Accordingly, depending on the distance between the gate of the memory cell MC1 and the word line driver 3, the boosting time of the reference word line RWL is delayed.

Likewise, when high-level column address signals CA0 and CA1 are supplied to the bit line decoder 5, the memory cell MC3 is selected as an object to be read. Since the high-level column address signals CA0 and CA1 are being transmitted through the signal lines 15 and 16 at this point, the p-channel MOS transistors PT3 to PT5 are all switched off, and a load resistance of the p-channel MOS transistors PT3 to PT5 is added to the reference word line RWL. Accordingly, depending on the distance between the gate of the memory cell MC3 and the word line driver 3, the boosting time of the reference word line RWL is further delayed.

With this nonvolatile semiconductor memory device of the second embodiment, the load resistance adjustment circuit 19 adjusts the load resistance of the reference word line RWL to be equal to the load resistance of the word line WL, depending on the distance from the word line driver 3 and a memory cell to be read. Accordingly, the boosting time of the gate of the reference cell RC can be the same as the boosting time of the gate of the memory cell, and the data read conditions can be equalized between the reference cell RC and the memory cell to be read. As a result, a sufficient read margin can be maintained, and a highly reliable data read operation can be performed at a high speed.

[Third Embodiment]

A nonvolatile semiconductor memory device in accordance with a third embodiment of the present invention has substantially the same structure as the nonvolatile semiconductor memory device of the first embodiment, except that the load capacity adjustment circuit 14 shown in FIG. 5 is replaced with a driver size adjustment circuit 20.

Figure 7:
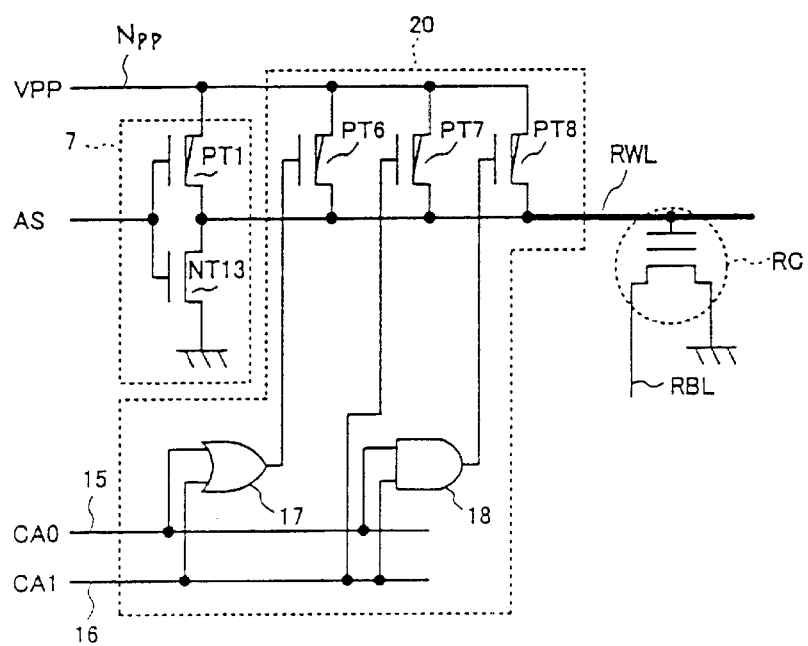
FIG. 7 is a circuit diagram showing the structure of a nonvolatile semiconductor memory device in accordance with a third embodiment of the present invention.

In the following, the driver size adjustment circuit 20 will be described in detail. FIG. 7 is a circuit diagram showing a part of the structure of the nonvolatile semiconductor memory device of the third embodiment. As shown in FIG. 7, the driver size adjustment circuit 20 comprises the OR circuit 17, the AND circuit 18, and p-channel MOS transistors PT6 to PT8 connected in parallel between the reference word line RWL and a node Npp that supplies the word line booster voltage VPP.

The gate of the p-channel MOS transistor PT6 is connected to the output node of the OR circuit 17, and the gate of the P-channel MOS transistor PT7 is connected to the signal line 16. The gate of the p-channel MOS transistor PT8 is connected to the output node of the AND circuit 18.

Next, an operation performed by the nonvolatile semiconductor memory device of this embodiment will be described in detail. When low-level column address signals CA0 and CA1 are supplied to the bit line decoder 5, for instance, the memory cell MC0 is selected as an object from which data is read. Since the low-level column address signals CA0 and CA1 are being transmitted through the signal lines 15 and 16 at this point, the p-channel MOS transistors PT6 to PT8 are all switched on. Accordingly, the p-channel MOS transistors PT6 to PT8 connected in parallel between the reference word line RWL and the node Npp are all switched on, thereby maximizing the size of the driver for driving the reference word line RWL.

When a high-level column address signal CA0 and a low-level column address signal CA1 are supplied to the bit line decoder 5, the memory cell MC1 is selected as an object from which data is read. Since the high-level column address signal CA0 is being transmitted through the signal line 15 and the low-level column address signal CA1 is being transmitted through the signal line 16 at this point, the output signal of the OR circuit 17 becomes high to switch only the p-channel MOS transistor PT6 off. Because of this, the driver size for the reference word line RWL is reduced by the size of the p-channel MOS transistor PT6. Accordingly, depending on the distance between the word line driver 3 and the gate of the memory cell MC1, the boosting time of the reference word line RWL is delayed.

Likewise, when high-level column address signals CA0 and CA1 are supplied to the bit line decoder 5, the memory cell MC3 is selected as an object from which data is read out. Since the high-level column address signals CA0 and CA1 are being transmitted through the signal lines 15 and 16 at this point, the p-channel MOS transistors PT6 to PT8 are all switched off, and the size of the driver for driving the reference word line RWL is minimized. Accordingly, depending on the distance between the word line driver 3 and the gate of the memory cell MC3, the boosting time of the reference word line RWL is further delayed.

As described above, in the nonvolatile semiconductor memory device of this embodiment, the driver size adjustment circuit 20 adjusts the size of the driver for driving the reference word line RWL, depending on the distance between the word line driver 3 and a memory cell from which data is read out. Thus, regardless of the location of the memory cell, the gate of the reference cell RC can be started up at the same timing as the gate of the memory cell. As a result, the data read conditions are equalized between the reference cell RC and the memory cell to be read. Thus, a sufficient read margin can be maintained, so that a highly reliable data read operation can be performed at a high speed.

[Fourth Embodiment]

A nonvolatile semiconductor memory device in accordance with a fourth embodiment of the present invention has substantially the same structure as the nonvolatile semiconductor memory device of the first embodiment, except that the nonvolatile semiconductor memory device of the fourth embodiment can perform a page mode operation.

Figure 8:
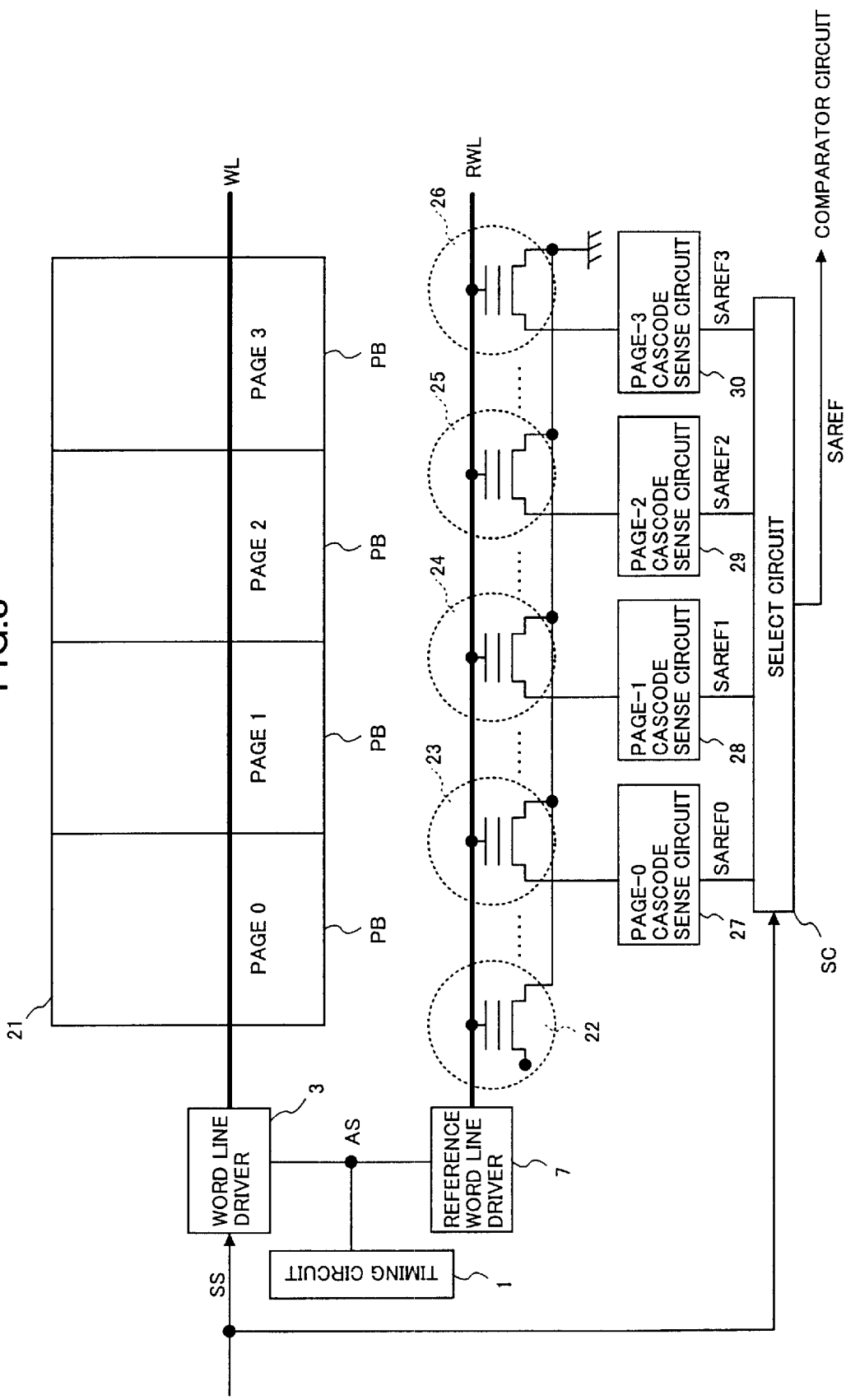
FIG. 8 shows the structure of a nonvolatile semiconductor memory device in accordance with a fourth embodiment of the present invention.

FIG. 8 shows the structure of the nonvolatile semiconductor memory device in accordance with the fourth embodiment of the present invention. As shown in FIG. 8, the word line WL connected to the word line driver 3 is wired through a memory cell array 21 that is made up of a plurality of page blocks PB. In FIG. 8, the memory cell array 21 includes four page blocks PB corresponding to page 0 to page 3. Each of the page blocks PB is provided with an input/output (I/O) circuit for inputting and outputting all the data in the block.

In this nonvolatile semiconductor memory device, a page-0 reference cell 23, a page-1 reference cell 24, a page-2 reference cell 25, a page-3 reference cell 26, and a dummy cell 22 are connected to the reference word line RWL at each gate. Each source of the reference cells 23 to 26 and the dummy cell 22 is grounded.

A page-0 cascode sense circuit 27 is connected to the drain of the page-0 reference cell 23, and a page-1 cascode sense circuit 28 is connected to the drain of the page-1 reference cell 24. Likewise, a page-2 cascode sense circuit 29 is connected to the drain of the page-2 reference cell 25, and a page-3 cascode sense circuit 30 is connected to the drain of the page-3 reference cell 26. The drain of the dummy cell 22 is in a floating state.

The page-0 cascode sense circuit 27, the page-1 cascode sense circuit 28, the page-2 cascode sense circuit 29, and the page-3 cascode sense circuit 30 are all connected to a select circuit SC.

Figure 3:
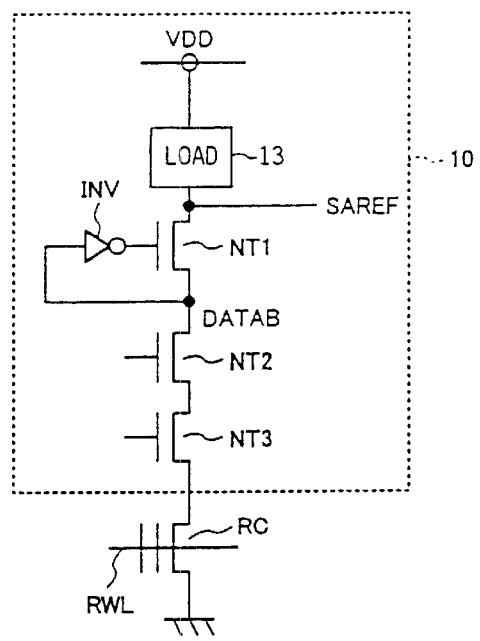
FIG. 3 is a circuit diagram showing the structure of a cascode sense circuit shown in FIG. 1.
Figure 4:
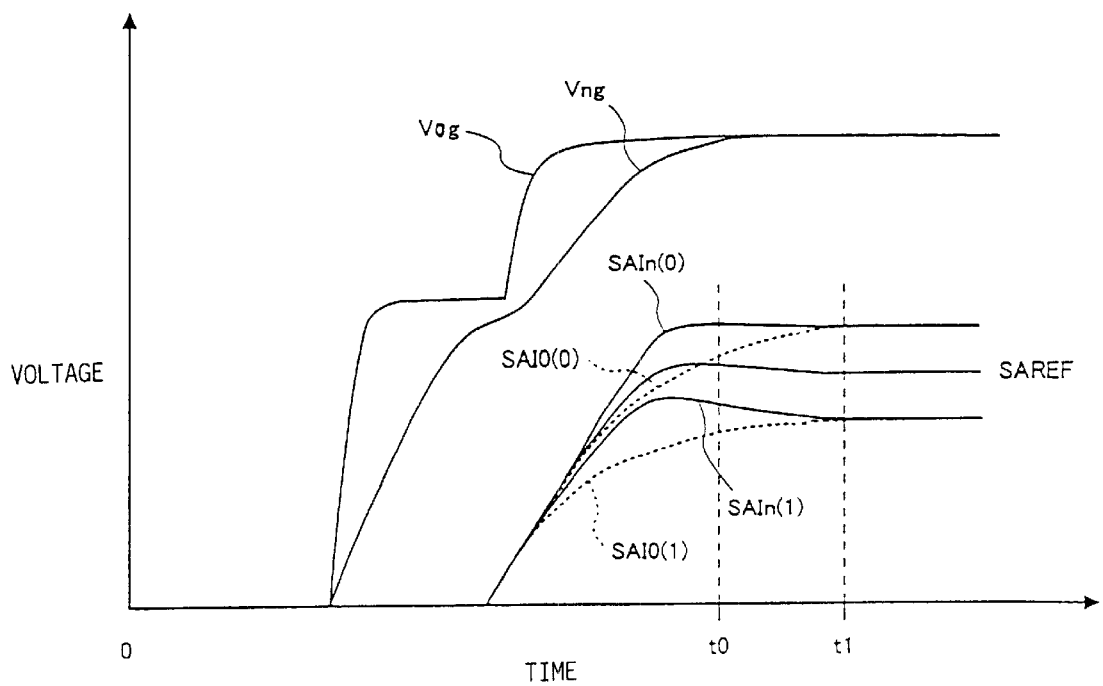
FIG. 4 is a graph showing operational characteristics of the nonvolatile semiconductor memory device shown in FIG. 1.

The cascode sense circuits 27 to 30 each have the same structure as the cascode sense circuit 10 shown in FIG. 3.

The page-0 cascode sense circuit 27 outputs a signal SAREF0 to the select circuit SC, and the page-1 cascode sense circuit 28 outputs a signal SAREF1 to the select circuit SC. The page-2 cascode sense circuit 29 outputs a signal SAREF2 to the select circuit SC, and the page-3 cascode sense circuit 30 outputs a signal SAREF3 to the select circuit SC.

In the nonvolatile semiconductor memory device of this embodiment having the above structure, when data is read from the memory cell included in the page block PB corresponding to page 0, which is the closest to the word line driver 3 shown in FIG. 8, the select circuit SC selectively supplies the comparator circuit 11 with the signal SAREF0 outputted from the page-0 cascode sense circuit 27, in accordance with the select signal SS for selecting page 0. Here, the comparator circuit 11 compares the data read out from the memory cell with the signal SAREF0.

Likewise, when data is read out from the memory cell included in the page block PB corresponding to page 3, which is the furthest from the word line driver 3, the select circuit SC selectively supplies the comparator circuit 11 with the signal SAREF3 outputted from the page-3 cascode sense circuit 30, in accordance with the select signal SS for selecting page 3. In this case, the comparator circuit 11 compares the data read out from the memory cell with the signal SAREF3.

When data is read out from the page block PB corresponding to page 0 and the page block PB corresponding to page 3 at the same time, the select circuit SC supplies the comparator circuit 11 with the signal SAREF0 in accordance with the select signal SS for selecting page 0 and the signal SAREF3 in accordance with the select signal SS for selecting page 3. Thus, a parallel data read operation can be accurately performed.

With the nonvolatile semiconductor memory device of this embodiment, the reference cell is selectively used for comparison, depending on the distance from the word line driver 3 of the page block PB to be read. Accordingly, regardless of the location of the page block to be read, data can be read out using the reference cell that has substantially the same gate boosting timing as the memory cell. By doing so, the data read conditions can be equalized between the reference cell and the memory cell to be read. Thus, a sufficient read margin can be maintained so that a highly reliable data read operation can be performed at a high speed.

[Fifth Embodiment]

In the foregoing embodiments, data is read out from a plurality of memory cells MC0 to MCn each having the gate connected to the word line WL, and the problem that the potential change of each gate varies depending on the location is solved. In a plurality of memory cells connected to the bit line, however, a similar problem arises, because the cell selection timing varies depending on the location of each memory cell due to an increase in potential. Accordingly, depending on the distance between the bit line decoder 5 and a memory cell on the bit line, a data read operation cannot be performed properly, because the distance differs from the length of the reference bit line RBL.

Figure 9:
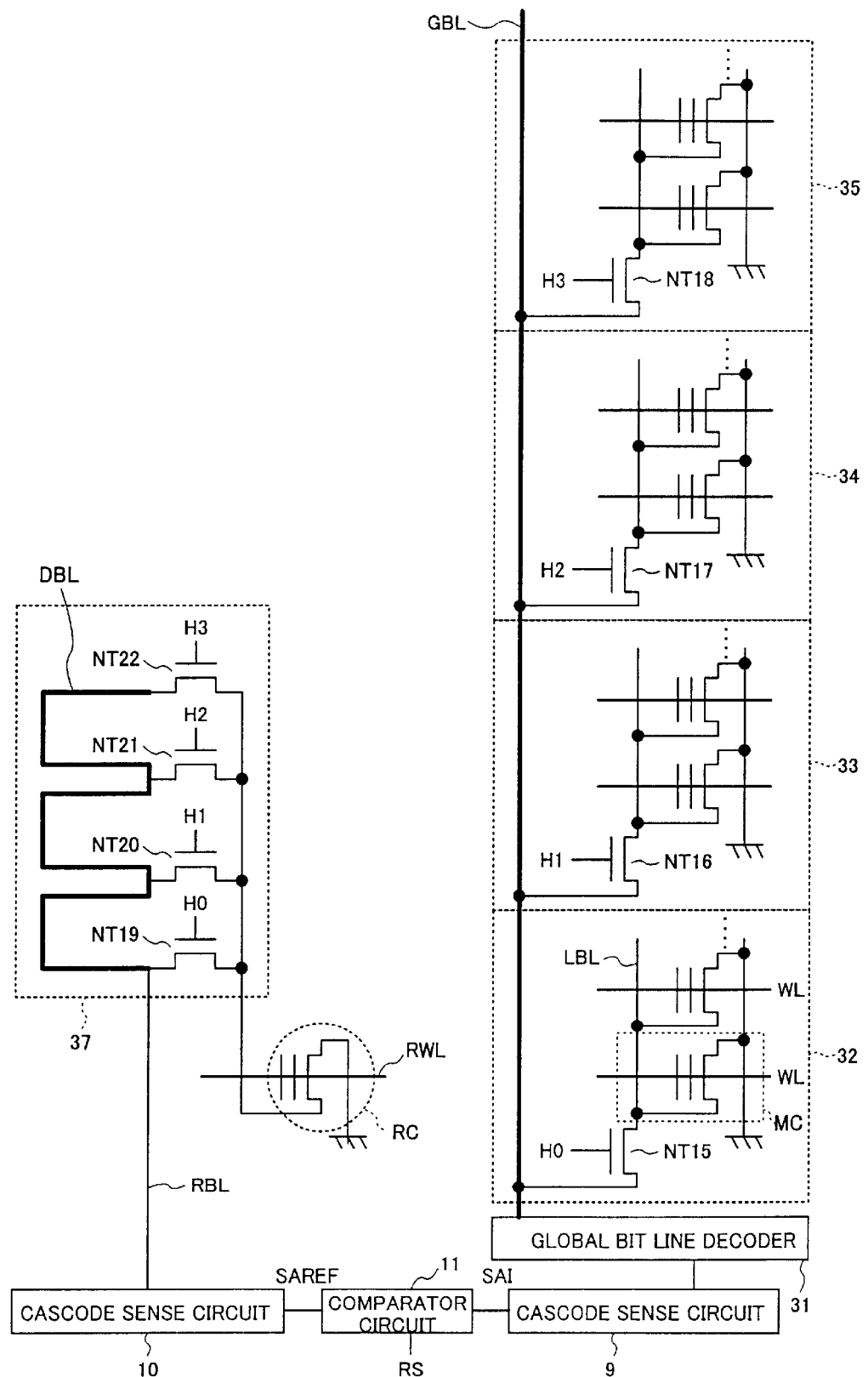
FIG. 9 is a circuit diagram showing the structure of a nonvolatile semiconductor memory device in accordance with a fifth embodiment of the present invention.

In this embodiment, to solve the above problem, the length of the reference bit line RBL is made variable in the following manner. FIG. 9 is a circuit diagram showing the structure of the nonvolatile semiconductor memory device in accordance with the fifth embodiment of the present invention. As shown in FIG. 9, this nonvolatile semiconductor memory device comprises the comparator circuit 11, the cascode sense circuits 9 and 10 connected to the comparator circuit 11, a global bit line decoder 31 connected to the cascode sense circuit 9, a global bit line GBL, 0th to third blocks 32 to 35, a local bit line LBL, a reference bit line RBL, a load resistance adjustment circuit 37 connected to the cascode sense circuit 10, and the reference cell RC connected to the load resistance adjustment circuit 37.

The 0th block 32 connects the memory cell MC, the word line WL, the local bit line LBL, and the global bit line GBL. The gate of the 0th block 32 includes an n-channel MOS transistor NT15 to which a signal H0 for selecting the local bit line LBL is supplied. The first to third blocks 33 to 35 each have the same structure as the 0th block 32, except that the n-channel MOS transistor NT15 is replaced by n-channel MOS transistors NT16 to NT18, respectively, and signals H1 to H3 are supplied to the gates.

The load resistance adjustment circuit 37 comprises a dummy bit line DBL connected to the reference bit line RBL, and n-channel MOS transistors NT19 to NT22 connected in parallel between the dummy bit line DBL and the drain of the reference cell RC. As shown in FIG. 9, the signals H0 to H3 are supplied to the gates of the n-channel MOS transistors NT19 to NT22, respectively.

In the nonvolatile semiconductor memory device of this embodiment having the above structure, when the signal H0 is high and the signals H1 to H3 are low, the 0th block 32, which is the closest to the global bit line decoder 31, is selected as an object to be read. More specifically, when only the signal H0 is high, the n-channel MOS transistor NT15 included in the 0th block 32 is switched on to read out the data from the memory cell MC to the global bit line GBL. At this point, only the n-channel MOS transistor NT19 is switched on in the load resistance adjustment circuit 37. Accordingly, the load resistance applied to the reference bit line RBL by the dummy bit line DBL is minimized.

Likewise, when the signal H3 is high and the signals H0 to H2 are low, the third block 35, which is the furthest from the global bit line decoder 31, is selected as an object to be read. More specifically, when only the signal H3 is high, the n-channel MOS transistor NT18 included in the third block 35 is switched on so as to read out the data from the memory cell MC to the global bit line GBL. At this point, only the n-channel MOS transistor NT22 is switched on in the load resistance adjustment circuit 37. Accordingly, the load resistance applied to the reference bit line RBL by the dummy bit line DBL is maximized.

As described above, in the nonvolatile semiconductor memory device of the fifth embodiment, the load resistance adjustment circuit 37 adjusts the load resistance applied to the reference bit line RBL, depending on the distance between the global bit line decoder 31 and a block from which data is read, i.e., depending on the location of the memory cell to be read on the bit line. Accordingly, regardless of the location of the memory cell to be read, the data can be read out from the reference cell RC at the same timing as reading from the memory cell. As a result, the data read conditions via the bit line can be equalized between the reference cell RC and the memory cell MC to be read. Thus, a sufficient read margin can be maintained so that a highly reliable data read operation can be performed at a high speed.

The present invention is not limited to the specifically disclosed embodiments, but variations and modifications may be made without departing from the scope of the present invention.

The present application is based on Japanese priority application No. 2000-166322, filed on Jun. 2, 2000, the entire contents of which are hereby incorporated by reference.

What is claimed is:

1. A semiconductor memory device comprising:
   a memory cell having a gate connected to a word line, a first signal being read out from the memory cell;
   a reference cell having a gate connected to a reference word line, a second signal being read out from the reference cell; and
   a boosting adjustment unit that adjusts timing of the rising of a voltage of the gate of the reference cell in accordance with a location of connection of the gate of the memory cell to the word line,
   wherein data stored in the memory cell is read out in accordance with a result of a comparison between the first signal and the second signal.

2. The semiconductor memory device as claimed in claim 1, further comprising a reference word line driver that drives the reference word line,
   wherein the boosting adjustment unit adjusts a load capacity or a load resistance of the reference word line driver with respect to the reference word line.

3. The semiconductor memory device as claimed in claim 1, further comprising a reference word line driver that drives the reference word line,
   wherein the boosting adjustment unit adjusts a driving performance of the reference word line driver.

* * * * *